US012794193B2

(12) United States Patent
Farmer et al.

(10) Patent No.: US 12,794,193 B2
(45) Date of Patent: Nov. 10, 2026

(54) MULTI-AXIS FLEXURE AND TILT MOUNT FOR LASER DIODE BEAM GENERATORS

(71) Applicant: JoeScan, Inc., Vancouver, WA (US)

(72) Inventors: Jason Farmer, Vancouver, WA (US); John Joseph Kollmann, Portland, OR (US)

(73) Assignee: JoeScan, Inc., Vancouver, WA (US)

( * ) Notice: Subject to any disclaimer, the term of this patent is extended or adjusted under 35 U.S.C. 154(b) by 933 days.

(21) Appl. No.: 17/816,967

(22) Filed: Aug. 2, 2022

(65) Prior Publication Data

US 2023/0139114 A1 May 4, 2023

Related U.S. Application Data

(60) Provisional application No. 63/263,316, filed on Oct. 29, 2021.

(51) Int. Cl.
*H01S 5/02315* (2021.01)
*H01S 5/02365* (2021.01)
*H01S 5/02375* (2021.01)

(52) U.S. Cl.
CPC ...... *H01S 5/02315* (2021.01); *H01S 5/02365* (2021.01); *H01S 5/02375* (2021.01)

(58) Field of Classification Search
CPC ............. H01S 5/02315; H01S 5/02365; H01S 5/02375; H01S 5/02212; G02B 7/005; G02B 7/021
USPC ............... 359/819, 871, 873, 874, 822, 892; 248/487, 183.1, 278.1, 183.2, 284.1, 485, 248/913
See application file for complete search history.

(56) References Cited

U.S. PATENT DOCUMENTS

| | | | | | |
|---|---|---|---|---|---|
| 3,407,018 | A * | 10/1968 | Miller | G02B 7/004 | 359/896 |
| 5,000,557 | A * | 3/1991 | Mefferd | H01S 3/076 | 359/872 |
| 5,703,683 | A * | 12/1997 | Hunt | G01J 3/44 | 359/874 |
| 2003/0161055 | A1* | 8/2003 | Woodard | G02B 7/00 | 359/819 |
| 2013/0219678 | A1* | 8/2013 | Brewster | F16B 2/065 | 24/486 |
| 2018/0217349 | A1* | 8/2018 | Jin | G02B 27/0944 | |

* cited by examiner

*Primary Examiner* — Kimberly T Wood
(74) *Attorney, Agent, or Firm* — Klarquist Sparkman, LLP

(57) ABSTRACT

Adjustable rotation stages include a dual-axis flexure that defines first and second axes of rotation A clamp secures a laser diode beam generator or other components to the dual-axis flexure and provides adjustable rotation about a third axis that is different from the first and second axes. Rotation adjustments can be made with screws facing in a common direction.

16 Claims, 8 Drawing Sheets

FIG. 1F
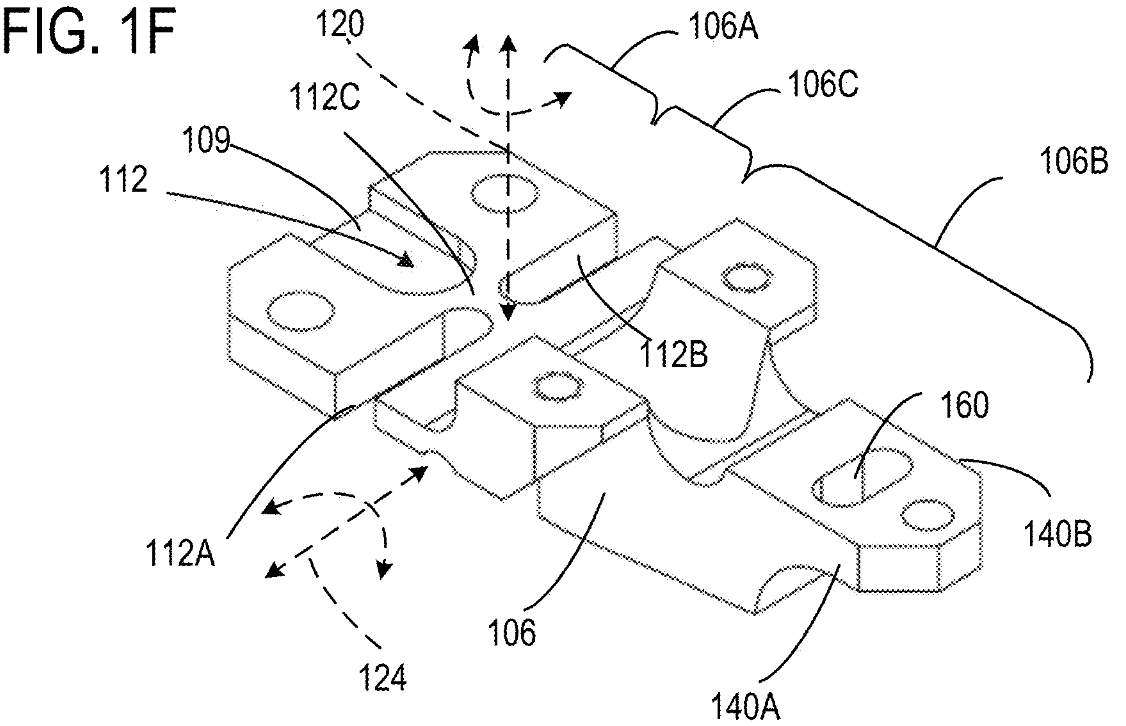
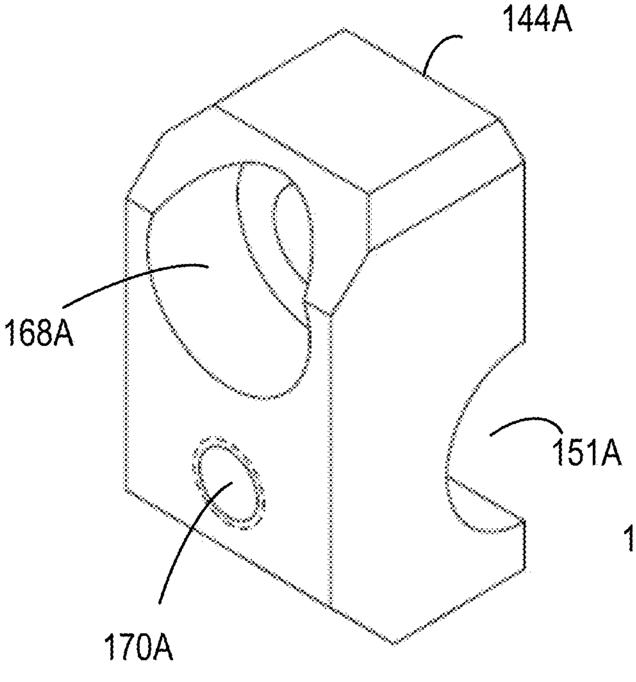
FIG. 1G
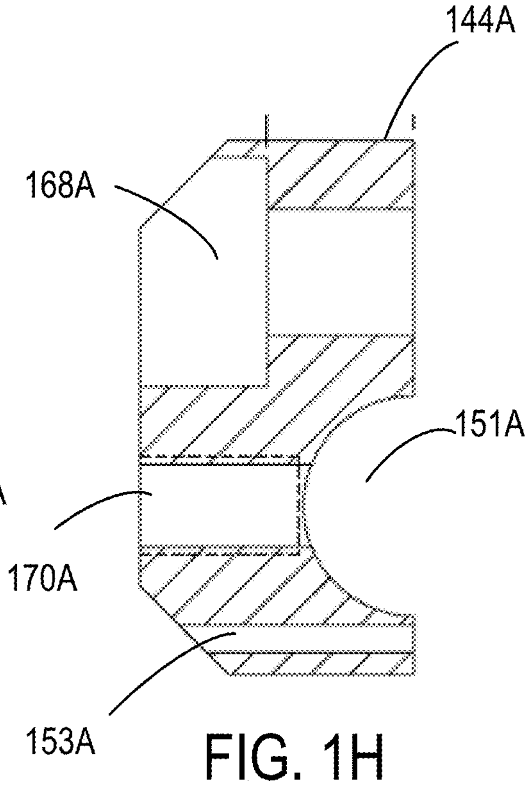
FIG. 1H

200

FIG. 3
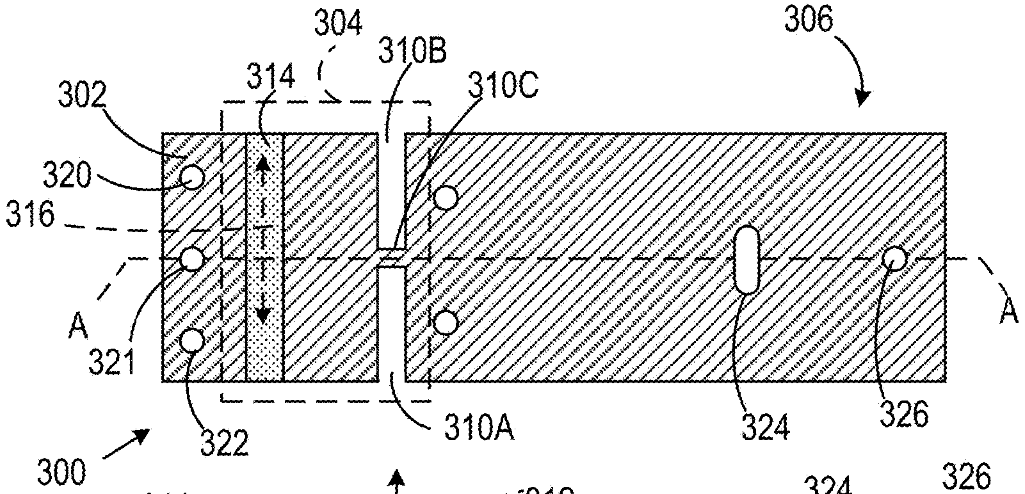
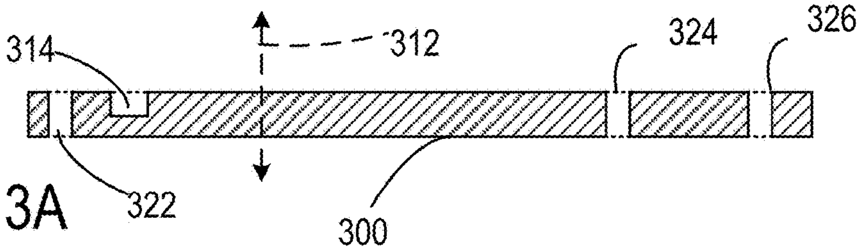
FIG. 3A
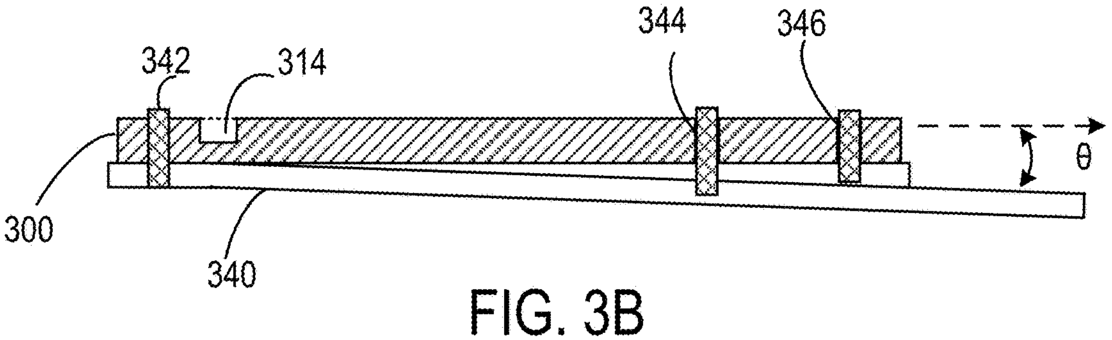
FIG. 3B

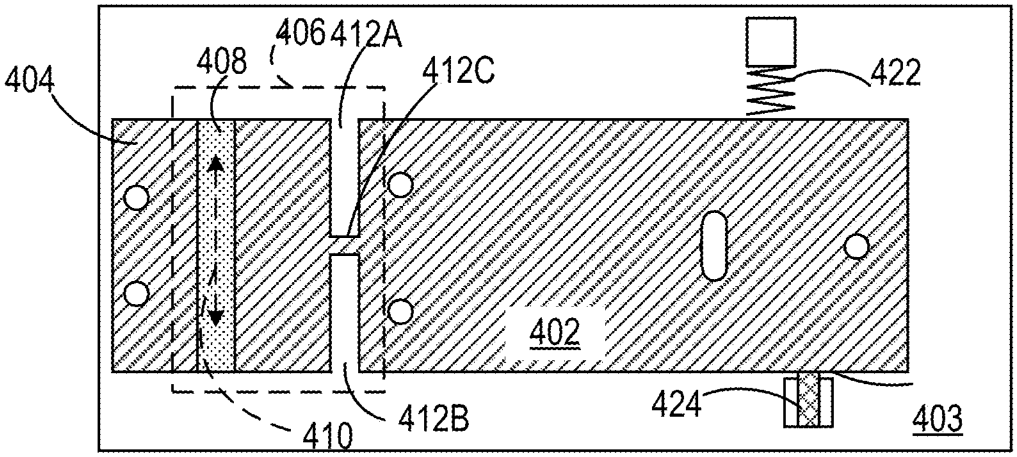
FIG. 4
FIG. 5
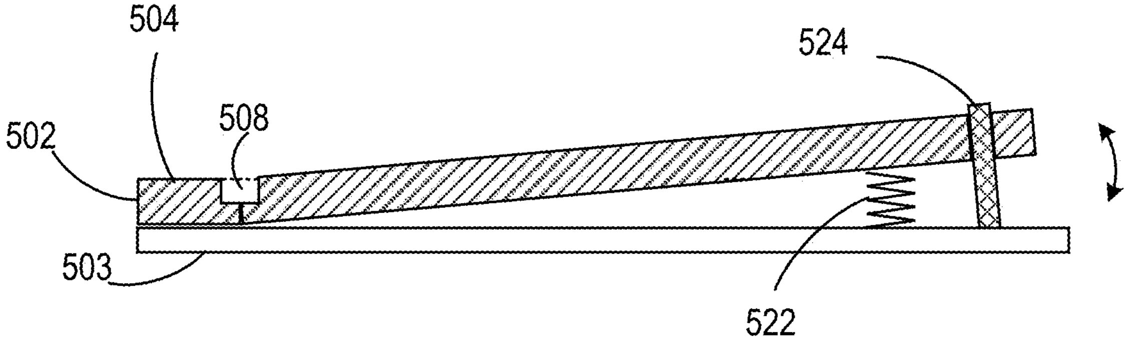

MULTI-AXIS FLEXURE AND TILT MOUNT FOR LASER DIODE BEAM GENERATORS

CROSS REFERENCE TO RELATED APPLICATION

This application claims the benefit of U.S. Provisional Patent Application No. 63/263,316, filed on Oct. 29, 2021, which is incorporated herein by reference in its entirety.

FIELD

The disclosure pertains to rotational mounts.

BACKGROUND

Many optical systems require precise pointing of optical beams, accurate orientation of optical detectors, or proper alignment of optical instruments. In some applications, multi-axis rotational alignment is required, often resulting in the need for multiple adjustments which can be dependent on each other so that setting a rotational alignment about one rotational axis disturbs alignment about other rotational axes. In such applications, providing suitable alignment can be tedious. In optical assemblies to be incorporated into larger systems, this tedious alignment can increase production costs and result in systems in which field re-alignment is difficult, requiring a skilled technician and/or specialized equipment. Moreover, in many cases, providing access to optical assemblies for alignment is challenging as access from multiple directions is required to adjust multi-axis rotations. Thus, an entire assembly may need to be exposed by, for example, removing protective covers and sub-systems which obstruct access. In addition to these challenges associated with multi-axis rotational alignment, practical systems require simple, inexpensive, and easily manufactured components for use in multi-axis rotational stages. For these and other reasons, alternative approaches are needed.

SUMMARY

Rotational mounts comprise a flexure member defining a base portion, a flexure portion, and a mounting portion, wherein the flexure portion defines a first flexure and a second flexure associated with rotations about a first axis and a second axis, respectively, wherein the second axis is orthogonal to the first axis. At least one clamp is situated to secure an optical system to the mounting portion of the flexure member so that the first flexure and the second flexure are operable to provide rotation about the first axis and the second axis in response to bending at the first flexure and the second flexure, respectively. The first flexure can be defined by a groove in the flexure member, the groove extending parallel to the first axis. The second flexure can be defined by opposing slots in the flexure member, the opposing slots extending parallel to the first axis. The flexure member can be situated between the base portion and the mounting portion. In some examples, the clamp has a cylindrical mounting surface that defines a third axis that is different from the first and second axes, wherein the cylindrical mounting surface is adapted to permit rotation of the optical system about the third axis. At least one ball clamp can be situated to produce bending of the second flexure. The at least one ball clamp can include an adjustment mechanism, a ball, and a retaining surface adapted to receive the ball, wherein the adjustment mechanism is situated to urge the ball against the flexure base to produce a rotation about the second axis. In examples, the at least one ball clamp includes a first ball clamp and second ball clamp, each comprising a respective adjustment mechanism, ball, and retaining surface adapted to receive the ball, wherein the adjustment mechanism of the first ball clamp is operable to urge the ball against the flexure base in a first direction to produce a rotation in a first direction about the second axis and the adjustment mechanism of the second ball clamp is operable to urge the ball against the flexure base in a second direction to produce a rotation in a second direction, opposite first direction about the second axis.

In some examples, a base is secured to the flexure member, wherein the base defines cavities situated to receive the balls of the first ball clamp and the second ball clamp, wherein the adjustment mechanisms of the first ball clamp and the second ball clamp are secured to the base. The adjustment mechanisms can include screws situated to contact respective balls and extend parallel to a common axis. In examples, centers of the balls of the first ball clamp and the second ball clamp are situated between the adjustment mechanisms and respective contact surfaces of the flexure member. In examples, the common axis is one of the first axis or the second axis. The adjustment mechanisms can be screws having screw heads that face the common axis.

In further examples, the clamp includes a bottom portion and a top portion and at least one fastener situated to secure the bottom portion to the top portion, wherein the at least one fastener extends along the common axis. The clamp can have a cylindrical mounting surface that defines a third axis that is different from the first and second axes, wherein the cylindrical mounting surface is adapted to permit rotation of the optical system about the third axis.

Rotational mounts comprise a flexure member having first and second flexures situated to provide rotations above a first rotational axis and a second rotational axis, respectively. A component mount is operable to secure a component to the flexure member and situated to provide component rotation about a third rotational axis, wherein the first, second, and third rotational axes are mutually orthogonal, wherein the flexure member and the component mount are situated to permit rotations about the first, second, and third axes to be provided from a common direction. First and second adjustment mechanisms corresponding to the first and second flexures, respectively, can be provided, wherein the first and second adjustment mechanisms include a first adjustment screw and a second adjustment screw, respectively, having parallel screw axes. In examples, a clamp member is operable to secure the component, wherein the clamp member is adjustable with at least one screw having an axis parallel to the screw axes of the first adjustment screw and a second adjustment screw.

Methods comprise rotatably securing a component to a flexure member and adjusting a rotation of the component about first and second axes with adjusters aligned along a common axis, wherein the first axis and the second axis are orthogonal. IN some examples, a rotation of the component about a third axis is adjusted with a third adjuster aligned along the common axis. In representative examples, the common axis is one of the first, second, or third axes.

The foregoing and other features and advantages of the disclosed technology will become more apparent from the following detailed description, which proceeds with reference to the accompanying figures.

BRIEF DESCRIPTION OF THE DRAWINGS

FIG. 1F is a perspective view of a dual-axis flexure member used in the unidirectional adjustable stage of FIGS. 1A-1B.

FIGS. 1G-1H are perspective and sectional views of a clamp used in a ball adjustor in the adjustable stage of FIGS. 1A-1B.

FIG. 3 illustrates a flexure member.

FIG. 3A is a sectional view of the flexure member of FIG. 3.

FIG. 3B illustrates the flexure member of FIGS. 3-3A as secured to a base for angular adjustment.

FIG. 4 illustrates an alternative adjustment mechanism and an associated dual-axis flexure.

FIG. 5 illustrates an alternative adjustment mechanism and an associated dual-axis flexure.

DETAILED DESCRIPTION

Figure 1A:
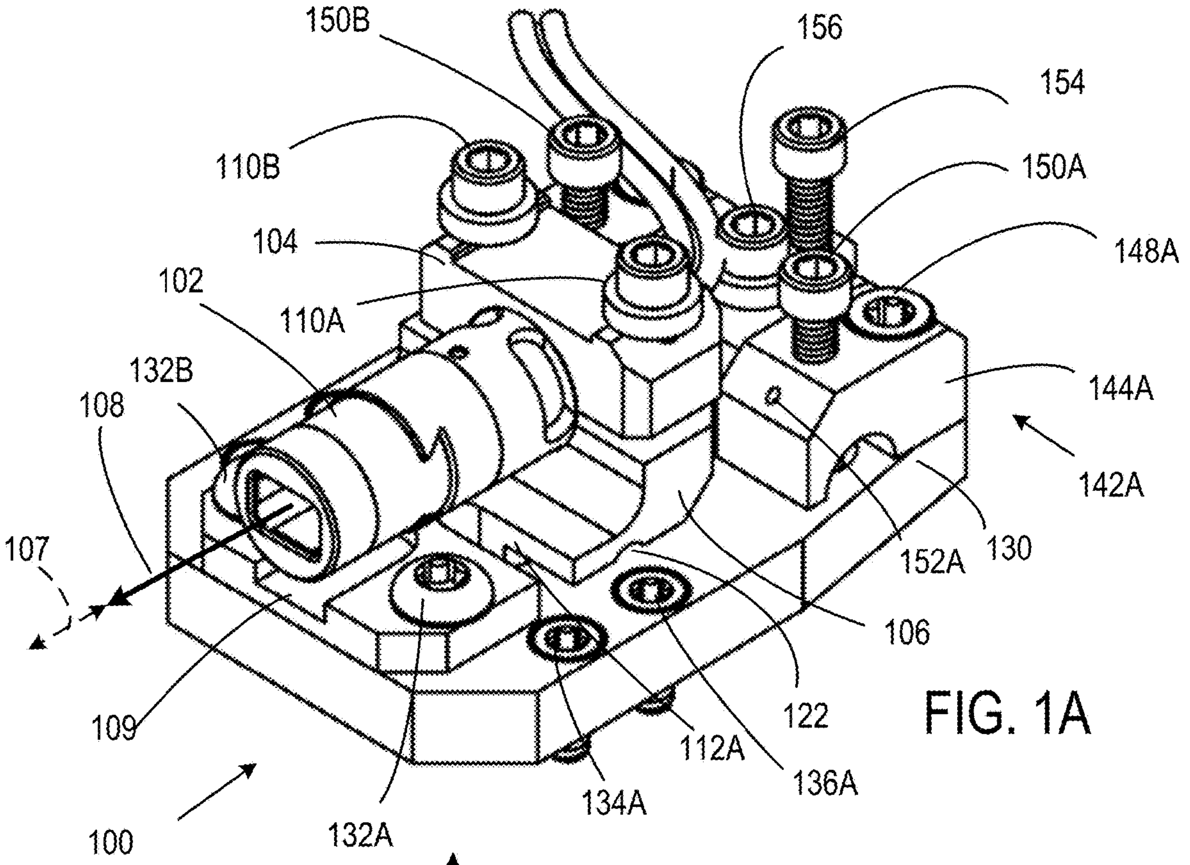
FIGS. 1A-1B are perspective views of a representative unidirectional adjustable stage.
Figure 1B:
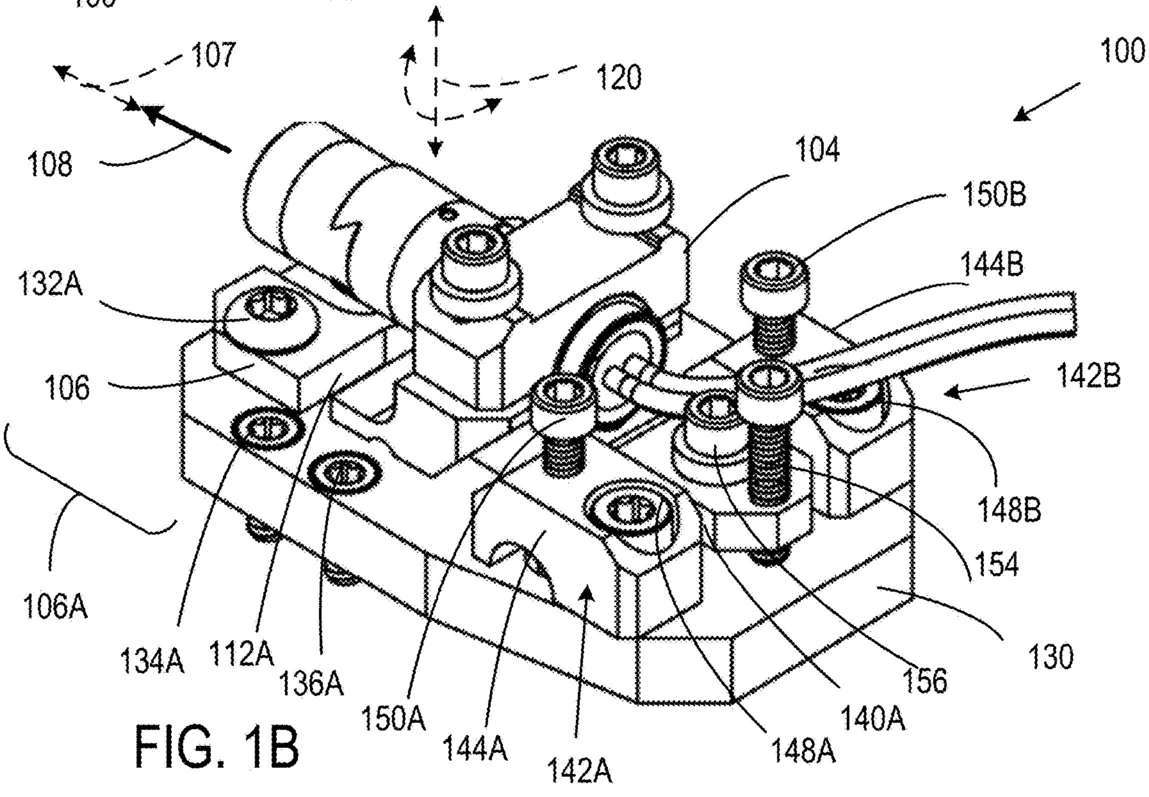

The disclosure pertains generally to rotational stages that permit rotational adjustments about two or more perpendicular or otherwise distinct axes with adjustment mechanisms situated to be accessible from a common direction. Particular examples are shown based on alignment of a laser line beam source that is secured to provide 3-axis rotation adjustments, but other components or systems can be similarly mounted. In some cases, dual-axis adjustments are provided.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

As used herein, a groove used to define a flexure is a thinned portion of a flexure base, typically elongated and extending from edge to edge of the flexure base permitting bending of the flexure base. A grooved cross-section is typically semicircular but other shapes such as other curved shapes (sections of ellipses, ovals, or other curved surfaces) or polygonal shapes such as squares, rectangles, hexagons, or symmetric or asymmetric polygons can be used, or other shapes defined by combinations of curves and lines. A groove generally permits rotation about an axis that is parallel to a groove length.

As used herein, a slot flexure is typically defined by slots in a flexure base that terminate at a flexure portion. The slots can be of the same or different lengths, and typically extend from the flexure portion to edges of a flexure base. Slot flexures can also be defined by single slot that terminates proximate a flexure base edge to leave a flexure portion. Typically, such a slot extends from one edge of the flexure base to the flexure portion. In typical examples, slots of the same dimensions are used and the flexure portion is centered on the flexure base. Such a slot flexure is referred to as a symmetric slot flexure. Slot flexures generally permit rotation about an axis that is perpendicular to a slot base.

As used herein, a base is a mounting structure to which a flexure plate can be secured. Such a base can be a component of an optical or other system or can be specially provided for use with a flexure.

As used herein, parallel refers to axis directions that are within 1, 2, 5, 10, or 20 degrees of each other.

In some examples, opposing adjustors or actuators are used to provide rotations. Opposing actuators can provide adjustments in two directions but in some cases, single adjustors or actuators or used, and in specific examples, springs or other elastic members provide forces opposite to those applied by the single actuator or adjustor.

Examples are provided in which multi-axis rotations can be adjusted with adjustors oriented in a common direction. Typically, screws can be used for adjustment and are aligned parallel to a common axis so that screw heads are accessible and adjustable from a common direction. Particular screw heads are shown in some examples for purposes of illustration, but cap, slot, Phillips, or others can be used. Rotational stages that permit adjustment of two or more rotation angles from a common direction are referred to herein as unidirectionally adjustable stages.

Example 1

Referring to FIGS. 1A-1H, an optical beam assembly 100 includes a laser beam generator 102 that generally includes a laser diode and one or more beam shaping optical elements such as lenses and apertures. The laser beam generator 102 is secured with a clamp 104 to a dual-axis flexure member 106 and the clamp 104 and dual-axis flexure member 106 are provided with suitable surfaces such as cylindrical surfaces 105A, 105B so that the laser beam generator 102 is rotatable about an axis 107 that is parallel to an axis of propagation of an emitted beam 108. Screws 110A, 110B can be used to secure the clamp 104 after a selected rotation of the laser beam generator 102 with the clamp 104. Rotation of the laser beam generator 102 about the axis 107 can be used to establish an orientation of a line beam or a beam polarization direction. For optical assemblies that include a detector, rotation can permit alignment of detector axes.

The dual-axis flexure member 106 defines a first flexure 112 based on channels 112A, 112B that separate a flex region 112C in the dual-axis flexure member 106. The first flexure 112 provides rotation about an axis 120. The dual-axis flexure member 106 defines a second flexure 121 based on a groove 122 that permits rotation about an axis 124. The first flexure 112 and the second flexure 121 are typically arranged so that the axes 120, 124 are perpendicular. The dual-axis flexure member 106 can include a recess 109 to permit rotation of the laser beam generator 102 without contacting the flexure base. Such a recess is not required for some rotations and size of mounted components.

Figure 1C:
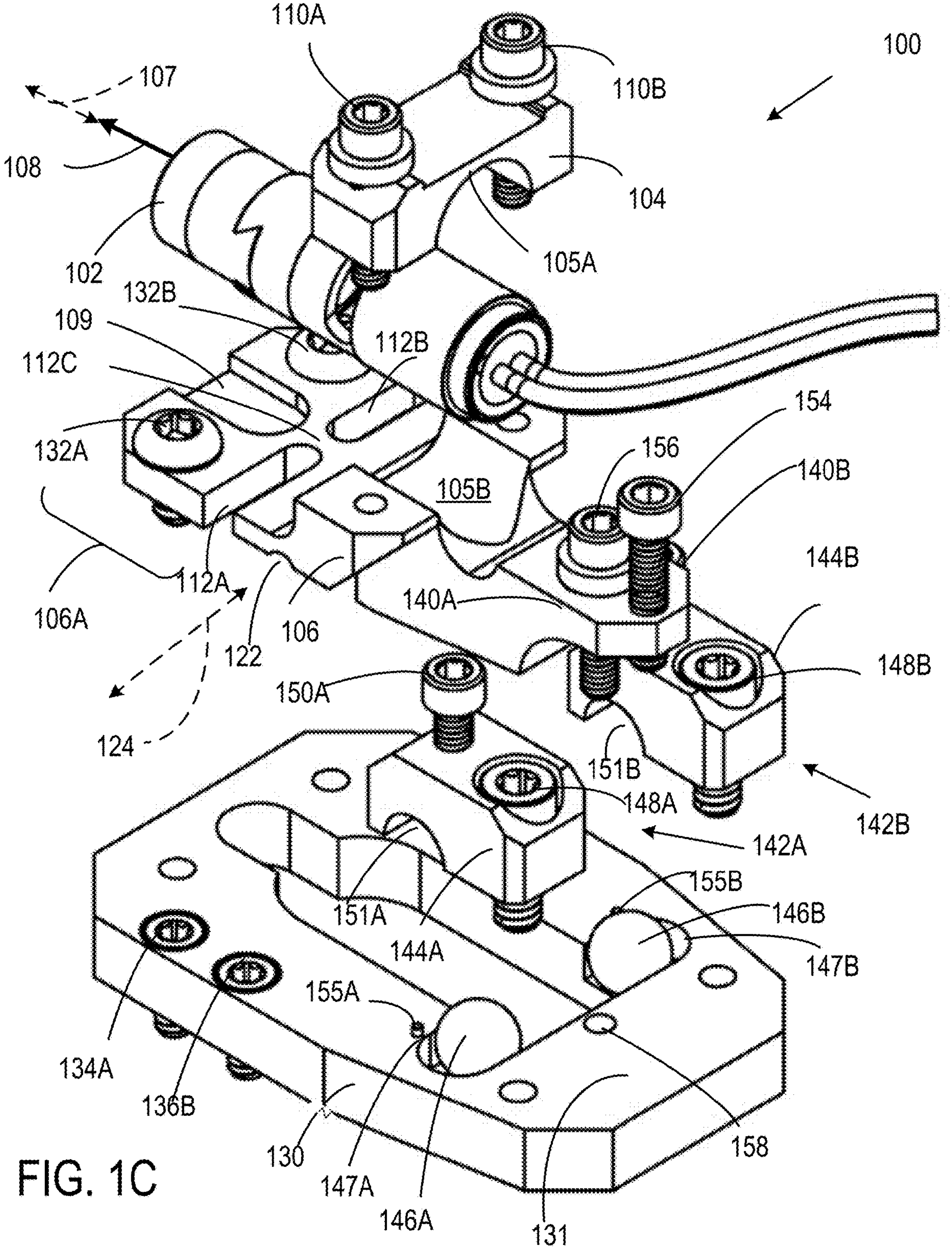
FIG. 1C is an exploded view of the unidirectional adjustable stage of FIGS. 1A-1B.
Figure 1D:
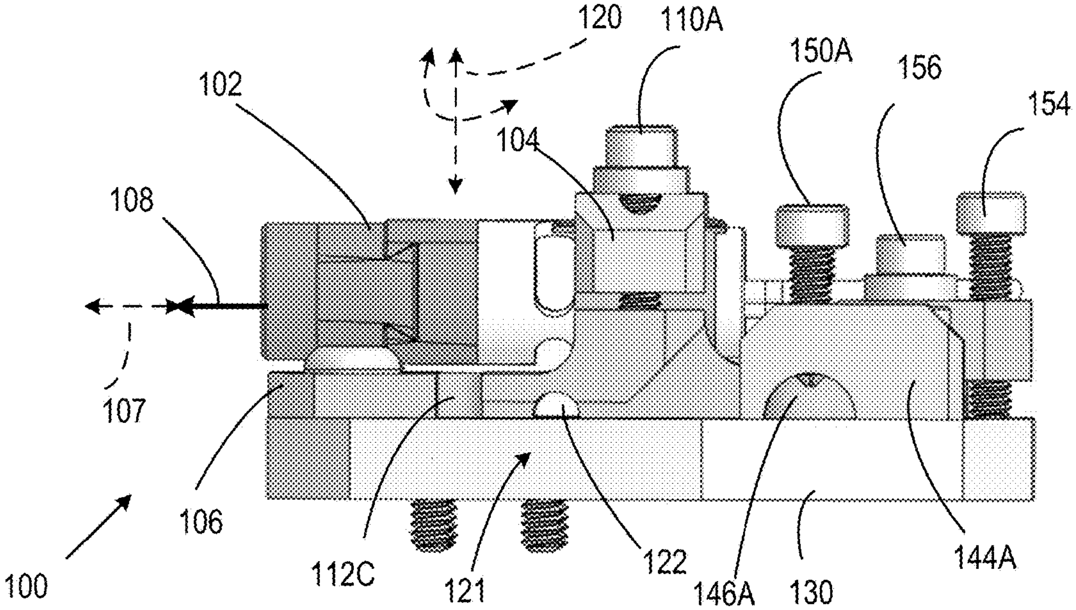
FIG. 1D is an elevational view of the unidirectional adjustable stage of FIGS. 1A-1B.
Figure 1E:
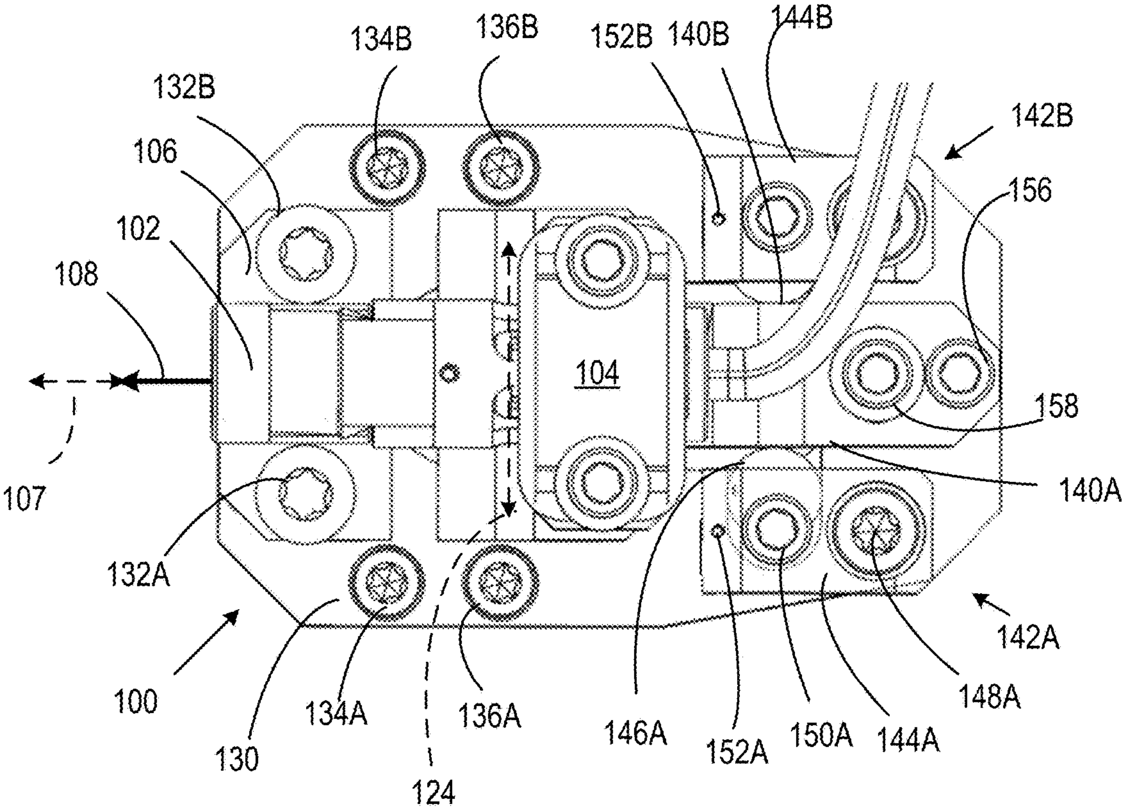
FIG. 1E is a plan view of the unidirectional adjustable stage of FIGS. 1A-1B.

The dual-axis flexure member 106 defines a flexure base portion 106A that can be used to secure the dual-axis flexure member 106 to a base 130 and a mounting portion 106B that is configured to securing an optical or other assembly for angular positioning and provide rotation of the mounted components about the axis 107. As shown, the flexure base portion 106A is secured to the base 130 with screws 132A, 132B but can be secured with other fasteners such rivets or adhesives. As shown, the base 130 is provided with clearance holes for use in mounting the base 130 with additional screws such as screws 134A, 134B, 136A, 136B. The dual-axis flexure member 106 also defines a flexure portion 106C that include slots, grooves, or other flexible members associated with the first and second flexures, and a mounting portion 106B that can receive components With the flexure base portion 106A secured to the base 130, various adjustment mechanisms can be provided to permit rotation of a component or assembly secured to the mounting portion 106B. Rotation about the axis 120 can be provided by pressing again surfaces 140A, 140B. In one example, ball adjusters 142A, 142B are provided that include respective ball clamps 144A, 144B, steel balls 146A, 146B, mounting screws 148A, 148B, and adjustment screws 150A, 150B. The mounting screws 148A, 148B secure the ball clamps 144A, 144B to the base 130 and include cavities 151A, 151B that receive the steel balls 146A, 146*b*. The steel balls 146A, 146B are situated with respect to the adjustment screws 150A, 150B so that the adjustment screws 150A, 150B can urge the steel balls 146A, 146B against the surfaces 140A, 140B, respectively. As shown in FIG. 1C, the base 130 can be provided with recesses 147A, 147B that retain the steel balls 146A, 146B, respectively. FIG. 1E illustrates off-center placement of the adjustment screw 150A with respect to the steel ball 146A so that the adjustment screws 150A is positioned to urge the steel ball 146A to the surface 140A and produce rotation about the axis 120. FIG. 1E also illustrates that the ball clamps 144A, 144B are further secured with respective pins 152A, 152B that extend into holes 155A, 155B in the base 130.

Rotation about the axis 124 can be adjusted with an adjustment screw 154 or other mechanism. The adjustment screw 154 is threaded into the dual-axis flexure member 106 and situated to press again a surface 131 of the base 130. A tip of the adjustment screw 154 can be shaped to permit motion across the surface 131 of the dual-axis flexure member 106. A lock screw 156 is received in a threaded hole 158 in the base 130 so that an adjustment can be secured. The lock screw 156 is situated to extend through a slot 160 so that the lock screw 156 does not impede rotation about the axis 120 as controlled by the ball adjusters 142A, 142B.

The ball clamp 144A is illustrated in further detail in FIGS. 1G-1H. A counterbore 168A is provided so that the screw 148A can be threaded into the base 130. The threaded hole 170A is adapted to receive the adjustment screw 150A so that it can press against a steel ball in the cavity 151A. A through hole 153A is provided for insertion of the pin 152A that is received by the corresponding hole 155A in the base 130.

In this example, all adjustment and lock mechanisms are situated to be accessed and adjusted from a single direction, and all are aligned parallel to the axis 120. Thus, single-direction control is possible, leading to convenient adjustment, particularly as installed in a larger system. In addition, each rotational adjustment can be locked or secured. For example, opposing ball adjusters are provided for rotation about the axis 120 and the rotation about the axis 124 can be secured with the lock screw 156. In other examples, springs, elastic washers, or other compliant members can be provided and adjustment screws can provide adjustments in one direction that can be opposed the compliant member. For some applications, it is advantageous to secure rotation elements to reduce rotational errors due to vibration or acceleration. In this example, adjustment screws have socket heads, but other types can be used.

In some cases, rotations can be described as roll, pitch, or yaw. As used herein, rotations about the axis 107 can be referred to as roll, rotations about the axis 124 can be referred to as pitch, and rotations about the axis 120 can be referred to as yaw. In this example, the dual-axis flexure member permits adjustment of pitch and yaw, and the clamp permits adjustments of roll.

Example 2

Figure 2:
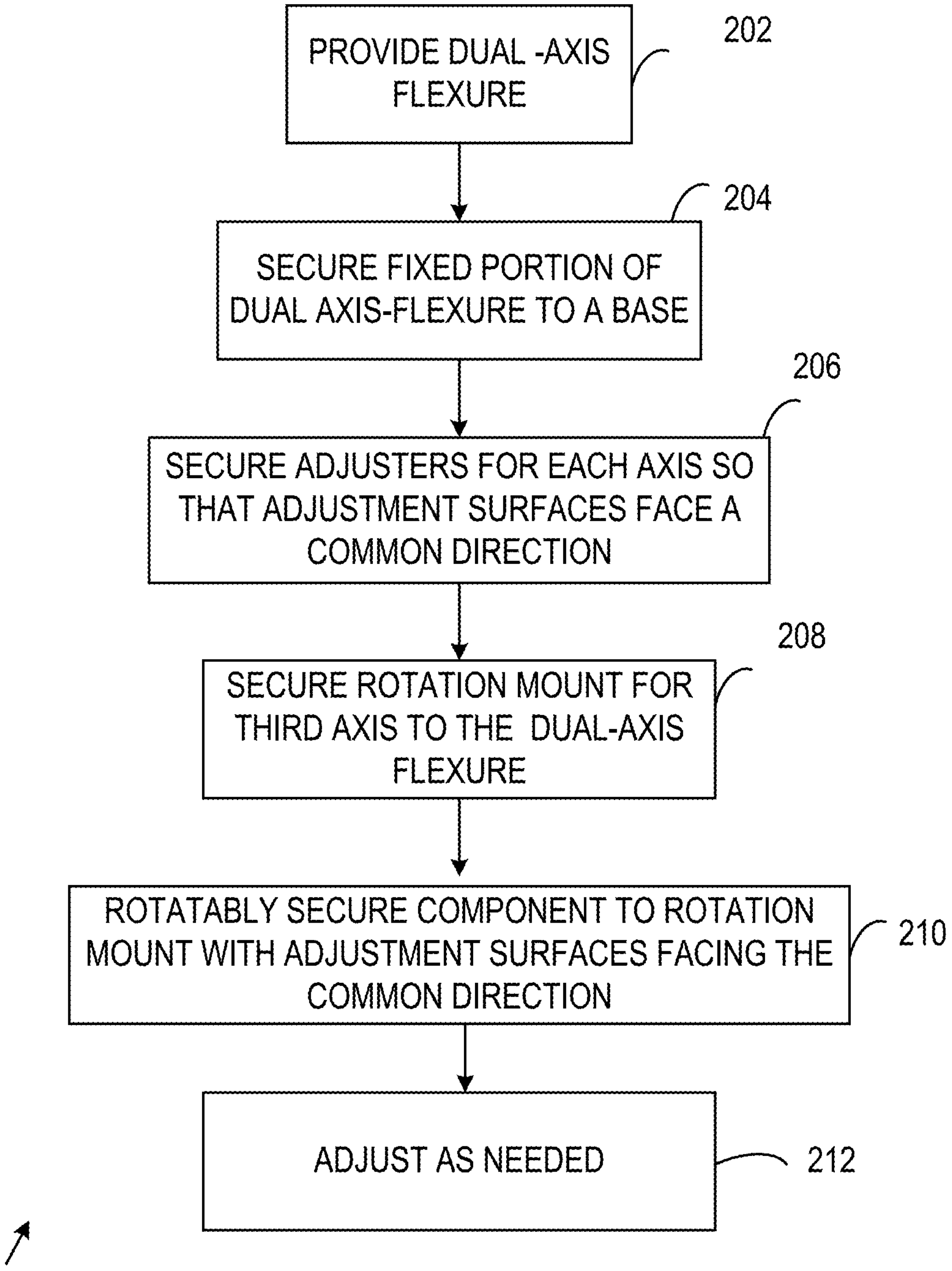
FIG. 2 illustrates a representative rotational adjustment method.

Referring to FIG. 2, a representative method 200 includes providing a dual-axis flexure (or other multi-axis flexure) at 202. At 204, the flexure is secured to a base and at 206, adjusters (for example, screws) associated with each axis are situated so that adjustment surfaces (such as screw heads) face a common direction and can be accessed from the common direction to establish rotation angles. A rotational mount associated with a third axis of rotation can be secured to the dual-axis flexure at 208. At 210, a selected component of system is secured to the rotational mount. At 212, rotational adjustments are made for angles of rotation about one, two, or three axes.

Example 3

Referring to FIGS. 3-3A, a flexure member 300 includes a flexure base portion 302, a flexure region 304, and a mounting portion 306. The flexure base portion 302 is typically secured to a base so that the flexure region 304 provides rotational adjustments of components secured to the mounting portion 306. The flexure region 304 includes a first flexure defined by a bridged region 310C and slots 310A, 310B. The first flexure provides rotations about an axis 312 that is perpendicular to the plane of FIG. 3 but is shown in the sectional view of FIG. 3A. A second flexure is defined by a groove, channel, or other thinned region 314 at one or both surfaces of the flexure member 300 and can permit rotation about an axis 316. The flexure member 300 also includes through holes 320-322 for mounting the flexure base portion 302 and a slotted through hole 324 for a lock screws and a tapped hole 326 for an adjustment screw.

FIG. 3B is a sectional view illustrating the flexure member 300 secured to a base 340 with a screw 342 inserted into the hole 321 and received by a threaded bore in the base 340. A lock screw 344 is situated to pull the base 304 and the flexure member 300 toward an adjustment screw 346 that establishes an angle of rotation θ about the axis 316 (perpendicular to the plane of FIG. 3B).

Example 4

Referring to FIG. 4, a flexure member 402 is secured to a base 403 at a base portion 404 of the flexure member 402. The flexure member 402 includes a flexure region 406 that includes a first flexure and a second flexure that can permit rotations about perpendicular axes. The first flexure is defined by a channel or groove 408 or other thinned portion of the flexure member 402 and can provide rotation about an axis 410. The second flexure is defined by slots 412A, 412B and a bridge region 412C and provides rotation about an axis that is perpendicular to the plane of FIG. 4. In this example, a spring 422 is secured to the base 403 and a screw 424 is oriented to urge the flexure member 402 toward the spring 422 to provide component rotation using the second flexure. As shown, access to the screw is in a direction parallel to the axis 410 but a ball clamp adjuster can be used to provide access from above the flexure member 402.

Example 5

Referring to FIG. 5, a flexure member 502 is secured to a base 503 at a base portion 504 of the flexure member 502. A flexure is defined by a channel or groove 508 or other thinned portion of the flexure member 502 and can provide rotation about an axis that is perpendicular to the plane of FIG. 5. In this example, a screw 524 is 522 is oriented to urge the flexure member 502 toward the base 403 to provide component rotation. As shown, access to the screw 524 is from above the flexure member 502. A second flexure can be provided as well such as illustrated above.

Example 6

Figure 6:
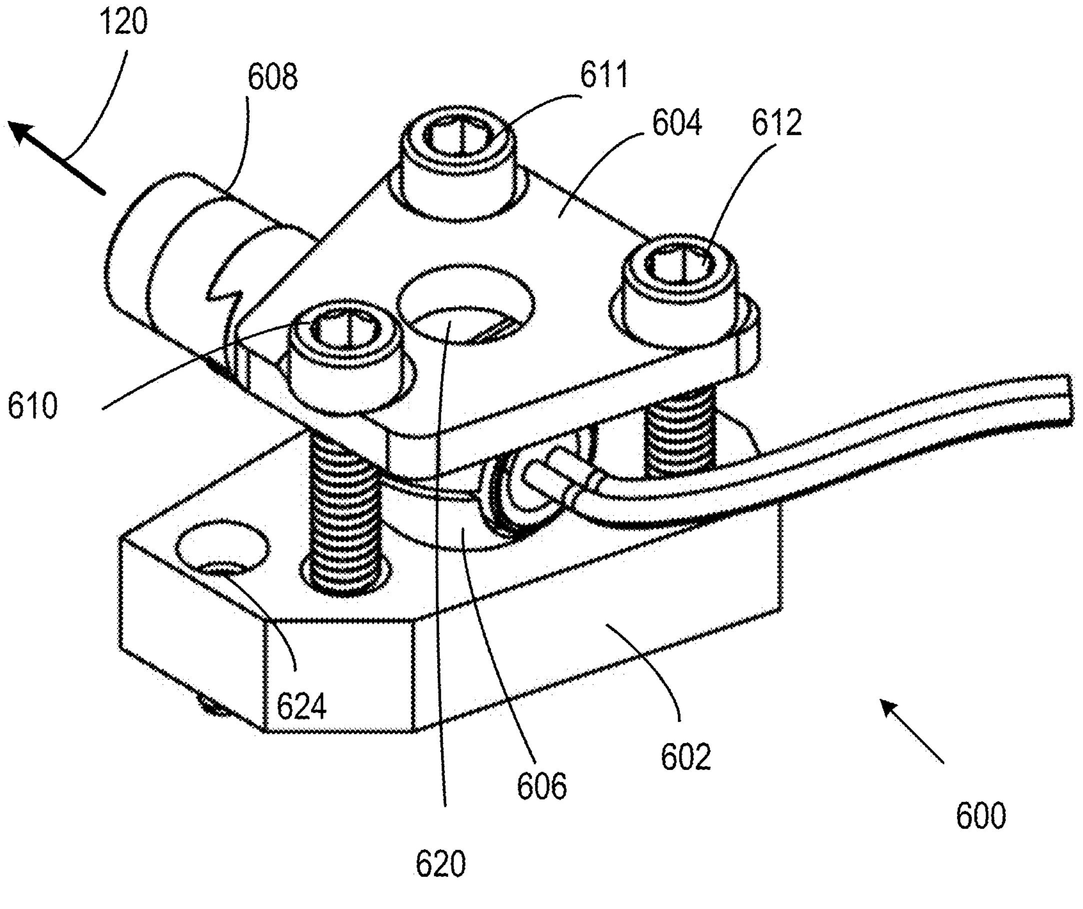
FIG. 6 illustrates another example of a unidirectional adjustable stage.

Referring to FIG. 6, a multi-axis rotational stage 600 includes a top plate 604 and a bottom plate 602 that are secured with screws 610-612. An optical system 608 such as a laser beam generator is rotatably secured between the top plate 604 and the bottom plate 602. The optical system 608 can be secured to or include a spherical mount 606 that is retained by the top plate 604 and the bottom plate 602, typically in one or more recesses or apertures such as hole 620; a corresponding hole or recess can be provided in the bottom plate 602 as well. The rotational stage 600 can be secured as needed with a screw or other fastener at bore 624. Adjustments with the screws 610-612 can be provided from the top and permit 3-axis rotation (roll, pitch, yaw), although the adjustments are not always independent.

In view of the many possible embodiments to which the principles of the disclosure may be applied, it should be recognized that the illustrated embodiments are only preferred examples and should not be taken as limiting the scope of the disclosure.

We claim:

1. A rotational mount, comprising:

a flexure member defining a base portion, a flexure portion, and a mounting portion, wherein the flexure portion defines a first flexure and a second flexure associated with rotations about a first axis and a second axis, respectively, wherein the second axis is orthogonal to the first axis; and at least one clamp situated to secure an optical system to the mounting portion of the flexure member so that the first flexure and the second flexure are operable to provide rotation of the optical system about the first axis and the second axis in response to bending at the first flexure and the second flexure, respectively, wherein the at least one clamp has a cylindrical mounting surface that defines a third axis that is different from the first and second axes, wherein the cylindrical mounting surface is adapted to permit rotation of the optical system about the third axis.

2. The rotational mount of claim 1, wherein the first flexure is defined by a groove in the flexure member, the groove extending parallel to the first axis.

3. The rotational mount of claim 2, wherein the second flexure is defined by opposing slots in the flexure member, the opposing slots extending parallel to the first axis.

4. The rotational mount of claim 1, wherein the second flexure is defined by opposing slots in the flexure member, the opposing slots extending parallel to the first axis.

5. The rotational mount of claim 1, wherein the flexure portion is situated between the base portion and the mounting portion.

6. The rotational mount of claim 1, further comprising at least one ball clamp situated to produce bending of the second flexure.

7. The rotational mount of claim 6, wherein the at least one ball clamp includes an adjustment mechanism, a ball, and a retaining surface adapted to receive the ball, wherein the adjustment mechanism is situated to urge the ball against the flexure flexure member mounting portion to produce a rotation about the second axis.

8. The rotational mount of claim 6, wherein the at least one ball clamp includes a first ball clamp and a second ball clamp, the first ball clamp and the second ball clamp each comprising a respective adjustment mechanism, ball, and retaining surface adapted to receive the ball, wherein the adjustment mechanism of the first ball clamp is operable to urge the ball against the flexure member in a first direction to produce a rotation in a first direction about the second axis and the adjustment mechanism of the second ball clamp is operable to urge the ball against the flexure member in a second direction to produce a rotation in a second direction, opposite first direction about the second axis.

9. The rotational mount of claim 8, further comprising a base secured to the flexure member, wherein the base defines cavities situated to receive the balls of the first ball clamp and the second ball clamp, wherein the adjustment mechanisms of the first ball clamp and the second ball clamp are secured to the base.

10. The rotational mount of claim 9, wherein the adjustment mechanisms include screws situated to contact respective balls and extend parallel to a common axis.

11. The rotational mount of claim 10, wherein centers of the balls of the first ball clamp and the second ball clamp are situated between the adjustment mechanisms and respective contact surfaces of the flexure member.

12. The rotational mount of claim 11, wherein the common axis is one of the first axis or the second axis.

13. The rotational mount of claim 12, wherein the adjustment mechanisms are screws having screw heads that face the common axis.

14. The rotational mount of claim 13, further comprising at least one fastener situated to secure the optical system to the mounting portion of the flexure member wherein the at least one fastener extends along the common axis.

15. The rotational mount of claim 1, further comprising the optical system.

16. The rotational mount of claim 15, wherein the optical system is a laser beam generator.

* * * * *